(12) United States Patent
Koyama et al.

(10) Patent No.: US 6,560,863 B2
(45) Date of Patent: May 13, 2003

(54) METHOD OF PRODUCING WIRING BOARD

(75) Inventors: Toshinori Koyama, Nagano (JP);
Mikiko Kobayashi, Nagano (JP);
Atsuhiko Hattori, Nagano (JP)

(73) Assignee: Shinko Electric Industries, Co., Ltd., Nagano (JP)

( * ) Notice: Subject to any disclaimer, the term of this patent is extended or adjusted under 35 U.S.C. 154(b) by 0 days.

(21) Appl. No.: 09/924,807

(22) Filed: Aug. 8, 2001

(65) Prior Publication Data
US 2002/0035784 A1 Mar. 28, 2002

(30) Foreign Application Priority Data
Aug. 11, 2000 (JP) .......................................... 2000-245074

(51) Int. Cl.$^7$ ................................................ H05K 3/10
(52) U.S. Cl. .............................. 29/846; 29/825; 29/840; 174/255; 174/258; 427/96
(58) Field of Search ........................ 29/846, 830, 825, 29/840; 174/255, 258; 427/96

(56) References Cited

U.S. PATENT DOCUMENTS

| | | | | |
|---|---|---|---|---|
| 4,816,323 A | * | 3/1989 | Inoue .......................... | 428/200 |
| 5,346,750 A | * | 9/1994 | Hatakeyama et al. ......... | 29/209 |
| 6,010,768 A | * | 1/2000 | Yasue et al. ................. | 428/209 |
| 6,365,844 B2 | * | 4/2002 | Nishii et al. ................. | 174/264 |
| 6,376,052 B1 | * | 4/2002 | Asai et al. ................... | 428/209 |

FOREIGN PATENT DOCUMENTS

| JP | A-60-109298 | | 6/1985 |
|---|---|---|---|
| JP | 03-225993 | * | 10/1991 |
| JP | 5-167227 | * | 7/1993 |
| JP | A-6-87964 | | 3/1994 |
| JP | A-8-253869 | | 10/1996 |
| JP | 9-3221 | * | 9/1997 |
| JP | A-10-310873 | | 11/1998 |
| JP | A-11-214838 | | 8/1999 |

* cited by examiner

Primary Examiner—Carl J. Arbes
(74) Attorney, Agent, or Firm—Paul & Paul

(57) ABSTRACT

A method of producing a wiring board having a plurality of wiring layers each being located on an electrical insulation layer, in which an electrical insulation layer is formed on a substrate using a resin material, and a conductor layer is formed on the surface of the electrical insulation layer by successive electroless plating and electroplating with copper, and is patterned to form a wiring layer, wherein, after the formation of the electrical insulation layer on the substrate, the electrical insulation layer is subjected to a plasma treatment and a subsequent ultraviolet treatment, and the electroless plating and the electroplating are then performed.

5 Claims, 4 Drawing Sheets

×2,000

×2,000

METHOD OF PRODUCING WIRING BOARD

BACKGROUND OF THE INVENTION

1. Field of the Invention

The invention relates to a method of producing a wiring board and, particularly, to a method of producing a wiring board in which a plurality of wiring layers, each being located on an electrical insulation layer, are formed.

2. Description of the Related Art

Among wiring boards used for mounting semiconductor devices thereon, there are products formed by a build-up process in which a plurality of wiring layers, each being located on an electrical insulation layer, are laminated. For the formation of the wiring layers, a resin material having an electrical insulation properties, such as a polyimide or epoxy, is coated on a substrate, or a resin film having an electrical insulation property is pressed on and adhered to a substrate, to thereby form an electrical insulation layer, after which a conductor layer is formed on the surface of the insulation layer through plating or the like. The conductor layer on the insulation layer can be then etched to provide a wiring layer having a certain pattern.

FIG. 5 shows an example of wiring board in which a wiring layer 14 is formed on an insulation layer 12 provided on each of surfaces of a core substrate 10, with the wiring layer 14 being formed by etching a conductor layer located on the insulation layer 12.

When a conductor layer is formed on the surface of an insulation layer by plating, it is conventional that the surface of the insulation layer is roughened (a desmear process) in advance of a plating process, in order to enhance the adhesion of the plated conductor layer to the surface of the insulation layer. The roughening is effected by etching the surface of the insulation layer (resin layer) using an etchant, such as potassium permanganate or sodium permanganate.

FIG. 6 is an enlarged cross sectional view schematically showing the surface of an insulation layer 12 roughened using an etchant. As seen in the drawing, a conductor is filled in surface pores or concavities of the insulation layer 12 formed by the roughening and, consequently, a patterned wiring layer 14a is intimately adhered to the insulation layer 12 through an anchor effect.

Nevertheless, in the case where a roughness of the surface of the roughened insulation layer is large, the surface roughness has an effect, during the formation of a conductor pattern by the etching of a conductor layer, on a precision of the conductor pattern, giving rise to problems, such as failure to create a very small wiring pattern with high precision.

FIG. 7 is a graph in which penetration of an etchant, during the patterning of a conductor layer by etching to form wiring lines, into the interface between an insulation layer and a patterned wiring line and measured from a side of the wiring line, is plotted versus a line space, as a function of a ten-point average surface roughness, $R_z$, of the insulation layer. The $R_z$ is measured according to JIS B 0601. The drawing reveals that the larger the surface roughness of the insulation layer, the larger the penetration. Thus, when the insulation layer has large surface pores, an etchant tends to penetrate into the interface between the insulation layer and the patterned wiring line via the surface pores of the insulation layer, during the formation of the patterned wiring lines by etching, causing the wiring lines having raised sides. Consequently, in the case of large surface roughness of the insulation layer, it is difficult to obtain a small and fine wiring pattern.

The increase in the surface roughness of an electrical insulation layer causes a problem of an increase in high-frequency signal transmission loss in view of the electrical properties of a wiring board. FIG. 8 shows graphs of calculated results of the change in high-frequency signal transmission loss depending on the surface roughness $R_a$ (center-line average roughness) of an insulation layer. The calculation was based on a width of wiring pattern of 20 micrometers, a thickness of insulation layer of 12 micrometers, a length of wiring line of 30 millimeters, and a dielectric constant of 3.4. The graphs reveal that the smaller the surface roughness of the insulation layer, the smaller the transmission loss.

On the other hand, the increase in the surface roughness of an insulation layer lowers the migration resistance of a wiring board. It is preferred for the insulation layer to have as a small surface roughness as possible. Thus, a technique which enables an insulation layer to have a small surface roughness, and the adhesion between an insulation layer and a conductor layer to be improved, is in demand.

As a method improving the adhesion between an insulation layer and a conductor layer, a method in which an insulating surface of a substrate is subjected to a plasma treatment, ion beam radiation, or ultraviolet radiation, is known (JP-A-11-214838, etc.). This technique improves the adhesion between an insulation layer and a wiring layer. The present invention provides a wiring board by forming a conductor layer by electroless plating and electroplating with copper, in order to improve the electrical properties of the wiring board. Since plated copper has a small adhesion to a resin material compared to plated nickel and others, plated copper is required to have a much stronger adhesion to an insulation layer when it is used to form a conductor layer.

SUMMARY OF THE INVENTION

The invention relates to a method of producing a wiring board in which a plurality of wiring layers, each being located on an electrical insulation layer, are formed.

An object of the invention is to provide a method of producing a wiring board in which, for the formation of a conductor layer on the insulation layer by electroless plating and electroplating thereof with copper, the surface roughness of an electrical insulation layer can be kept small, the adhesion between the insulation layer and the conductor layer can be satisfactory so as to enable a very fine pattern to be produced, and the wiring board has excellent electrical properties.

According to the invention, there is provided a method of producing a wiring board having a plurality of wiring layers each being located on an electrical insulation layer, in which an electrical insulation layer is formed on a substrate using a resin material, and a conductor layer is formed on the surface of the electrical insulation layer by successive electroless plating and electroplating with copper, and is patterned to form a wiring layer, wherein, after the formation of the electrical insulation layer on the substrate, the electrical insulation layer is subjected to a plasma treatment and a subsequent ultraviolet treatment, and the electroless plating and the electroplating are then performed.

It is preferred that the resin material for the formation of the electrical insulation layer comprises a nitrogen-containing compound, in that it improves the adhesion of the insulation layer to copper.

It is preferred that the electrical insulation layer after the plasma and ultraviolet treatments has a surface roughness $R_z \leq 1$ micrometer.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein.

DETAILED DESCRIPTION OF THE INVENTION

The invention relates to a method of producing a wiring board in which a wiring board is produced by forming wiring layers while interposing an electrical insulation layer between adjacent wiring layers, and is characterized by treatments prior to the deposition of a conductor layer on an electrical insulation layer by plating the surface of the insulation layer.

When a conductor layer is formed by the deposition of a plated material on the surface of an insulation layer, various plated materials can be deposited by selecting a plating solution. In the method of producing a wiring board according to the invention, the conductor layer is formed by plating with copper in order to provide the resultant wiring board with good electrical properties, such as high-frequency properties.

When the surface of the insulation layer is plated with copper, the surface is first electrolessly plated with copper, and is then electroplated with copper, to form a conductor layer (copper layer) of a predetermined thickness. The sublayer of electrolessly plated copper is formed to provide a power supply layer for the subsequent electroplating, and has, in general, a thickness of the order of 0.5 to 2.0 micrometers.

Plated copper has a defect of lower adhesion to a resin material compared to plated nickel and others. Accordingly, when a conductor layer is formed on the surface of an electrical insulation layer, made of a resin material, by plating with copper, it is necessary to subject the surface of the insulation layer to a treatment to ensure a certain adhesion thereof to the plated copper.

To evaluate the properties and peel strength of a conductor layer formed on the surface of an insulation layer, the inventors prepared a number of samples having an insulation layer on the surface of a resin sheet, and subjected them to various treatments prior to plating, as set forth hereinafter. The samples were made by hot-pressing a film of polyphenylene ether having a thickness of 50 micrometers onto the surface of the resin sheet to thereby form the insulation layer. The treatments to which the samples were subjected were plasma treatment, ultraviolet treatment, and roughening.

Figure 3:
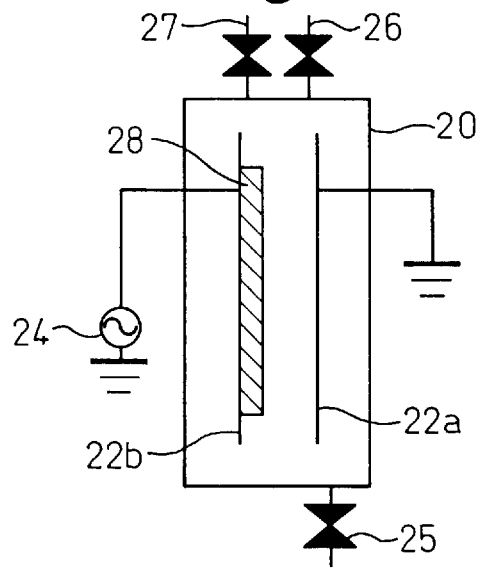
FIG. 3 illustrates an apparatus used for the plasma treatment of samples from the inventors' experiments.

FIG. 3 illustrates an apparatus which was used to subject the samples to the plasma treatment. The apparatus comprised a chamber 20, electrodes 22a, 22b, and a high-frequency electric current source for applying a high-frequency current between the electrodes 22a and 22b. The apparatus further comprised pipes and a valve 25 to connect the chamber 20 to a vacuum system (not shown) to evacuate the inside of the chamber 20 into vacuum, and gas introducing lines 26, 27. The sample of resin sheet is identified by 28, and was set on the electrode 22b. Oxygen and $CF_4$ gas were introduced to the chamber 20 to subject the sample 28 to a plasma etching. The plasma treatment was carried out at a $CF_4$ gas pressure of 80 Pa, and an output of 600 W. The plasma treatment may be performed by the use of oxygen alone, $CF_4$ gas alone, or a mixture of oxygen and $CF_4$.

Figure 4:
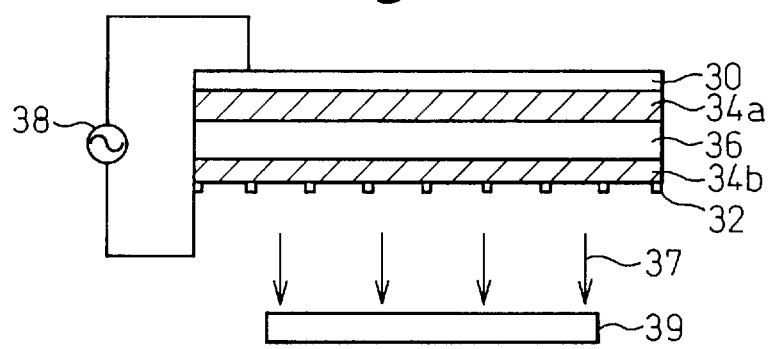
FIG. 4 illustrates an apparatus used for the UV treatment of samples from the inventors' experiments.
Figure 5:
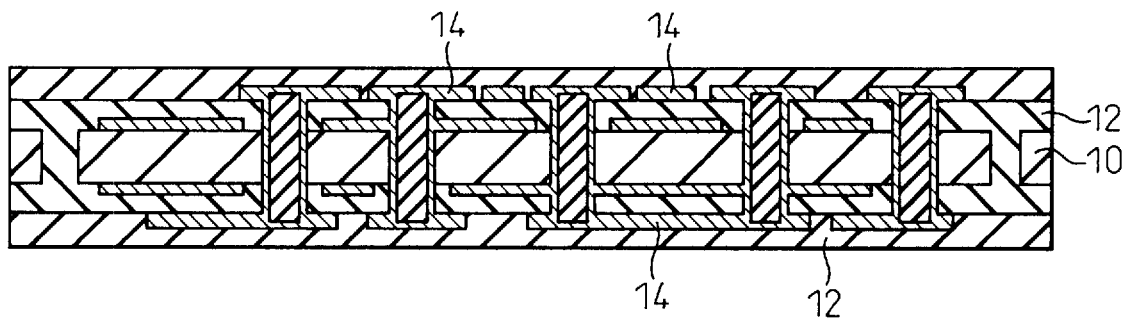
FIG. 5 illustrates a wiring board in which a wiring layer is formed on an insulation layer.
Figure 6:
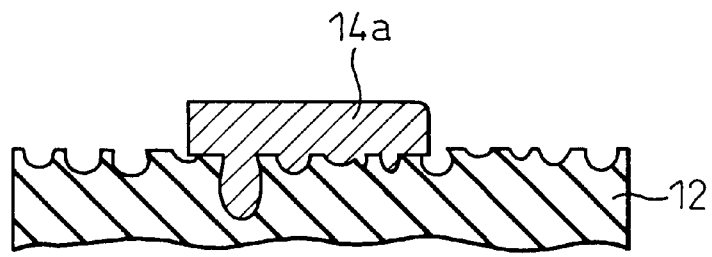
FIG. 6 is an enlarged cross sectional view schematically showing the surface of an insulation layer roughened by an etchant.
Figure 7:
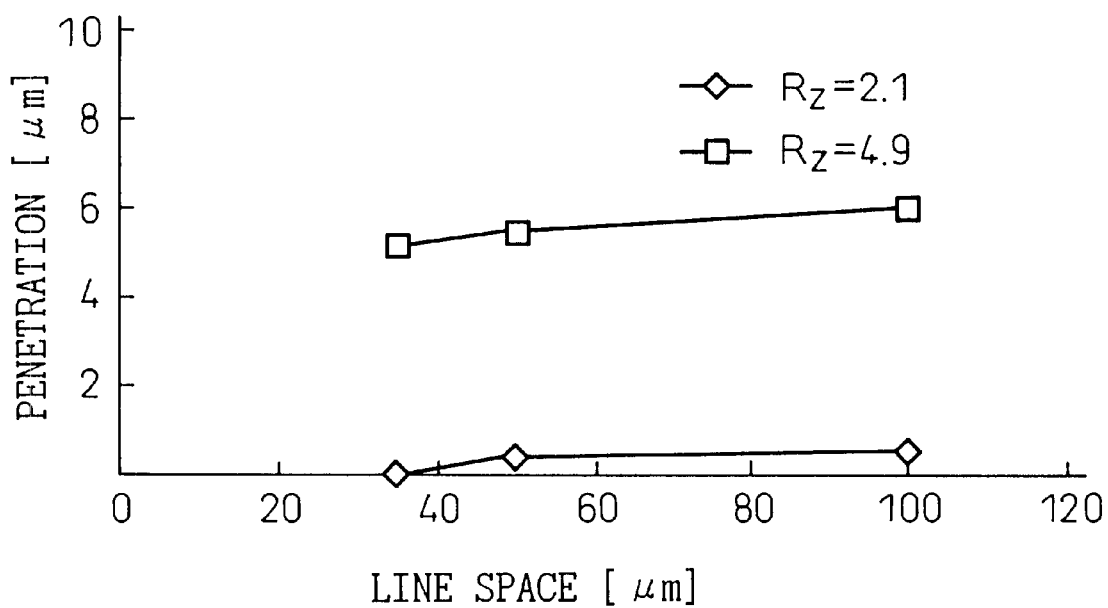
FIG. 7 is a graph in which the penetration of an etchant, into the interface between an insulation layer and a patterned wiring line and measured from a side of the wiring line, is plotted versus a line space, as a function of an average surface roughness, $R_z$, of the insulation layer.
Figure 8:
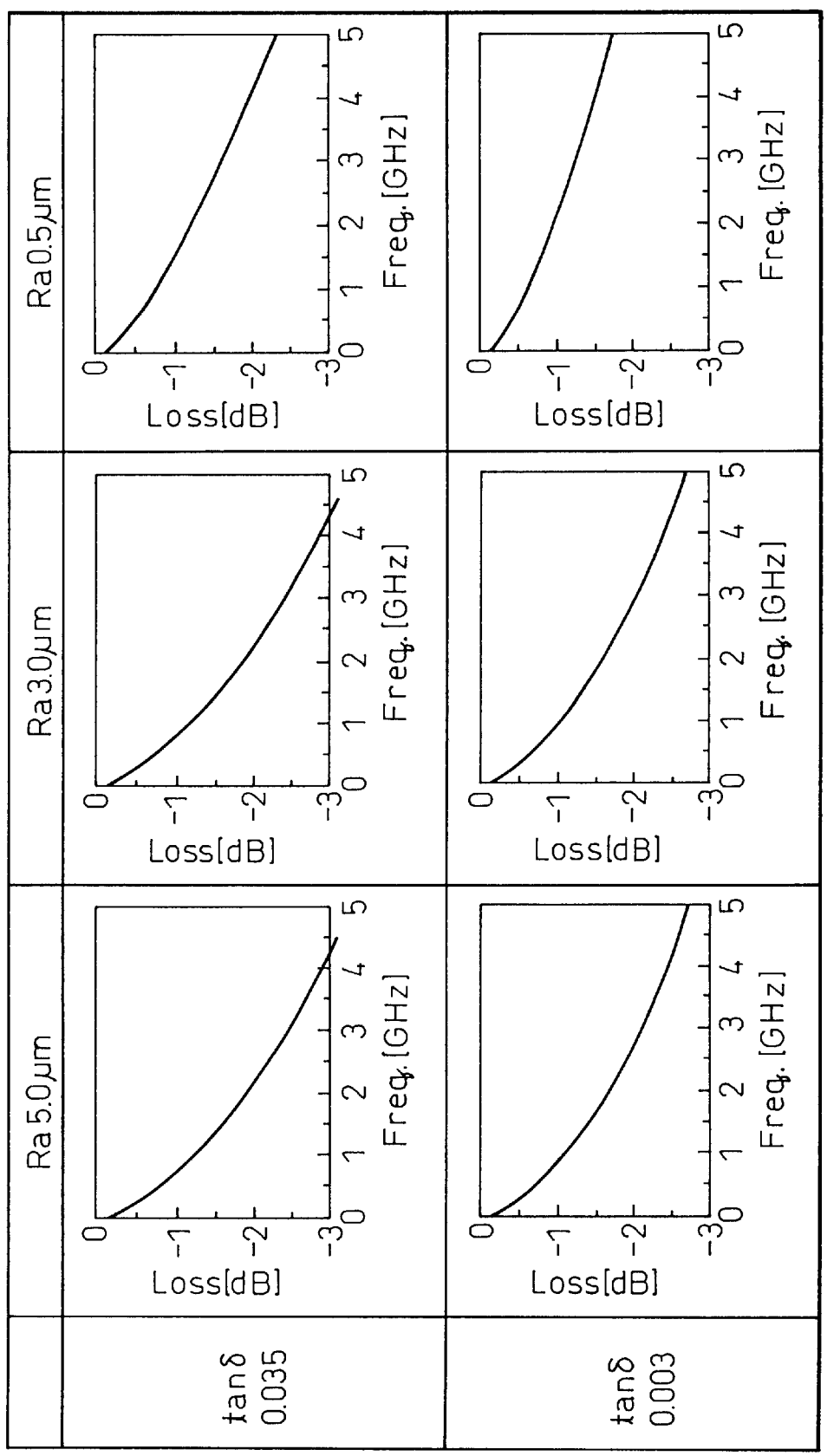
FIG. 8 shows graphs of calculated results of the change in high-frequency signal transmission loss depending on the surface roughness, $R_a$, of an insulation layer.

FIG. 4 illustrates an apparatus which was used to subject the samples to the ultraviolet (UV) treatment. A dielectric barrier discharge excimer lamp was used to irradiate the sample with ultraviolet light of 172 nm. The apparatus comprised metallic electrodes 30, 32, between which an high voltage of alternating current was applied from a current source 38 to radiate ultraviolet light 37 from the side of the metallic electrode 32, which had a lattice-like configuration, toward a sample 39. As illustrated, the apparatus further comprised dielectric members (quartz glasses) 34a, 34b, and a discharging gas (xenon gas) was filled in a cavity 36 sandwiched between the dielectric members 34a and 34b, to radiate monochromatic light of 172 nm. The sample 39 was positioned 1 millimeter away from the radiating face. An illuminance at the irradiated face was 7 mW/cm².

The roughening was the same as a desmearing treatment performed in a conventional process for making a wiring board. In the roughening treatment, a surface is subjected to the sequence of swelling, etching, and neutralizing processes to be roughened. In the experiments which the inventors made, swelling was carried out at 60° C. and for 5 minutes using a swelling solution based on organic solvent, etching was carried out at 80° C. and for 10 minutes using an etching solution based on sodium permanganate, and neutralization was carried out at 40° C. and for 5 minutes using a neutralizing solution based on sulfuric acid.

The samples were subjected to one or a combination of the above-mentioned treatments, and were then successively provided on the roughened surface of the resin layer with electrolessly plated copper and electroplated copper. For the electroless plating, the sample was soft-etched and pickled, and was then electrolessly plated with copper using an electroless plating solution comprising an activator and an accelerator at 35° C. and for 30 minutes, to have a plated film about 1.5 micrometers thick formed. The electroplating was performed at a current density of 1.0 ASD for 90 minutes, to provide a plated copper film about 20 micrometers thick.

After the electroless plating and before the electroplating, the appearance of the electrolessly plated conductor layer was observed, and after the electroplating, the appearance of the electroplated conductor layer was also observed, and the sample was subjected to a test to determine a peel strength of the plated conductor layer of copper. The peel strength test was performed by making cuts having a width of 1 cm in the plated copper layer of the sample, and peeling the strip of 1 cm width in the vertical direction from the sample at a peeling rate of 50 mm/min.

The results are shown in Table 1.

TABLE 1

| Samples | Treatments Before Platings | Conductor Layer After Electroless Plating | Conductor Layer After Electroplating | Peel Strength (N/cm) |
|---|---|---|---|---|
| 1 | 5 min. Plasma + 30 sec. UV | No anomaly observed | No anomaly observed | 9.8 |
| 2 | 5 min. Plasma + Roughening | No anomaly observed | No anomaly observed | 4.9 |
| 3 | 30 min. Plasma + Roughening | No anomaly observed | No anomaly observed | 3.92 |
| 4 | 5 min. Plasma + Roughening + 30 sec. UV | No anomaly observed | Blistered | |
| 5 | 5 min. Plasma | No anomaly observed | Partially blistered | 3.92 |
| 6 | 30 sec. UV | No anomaly observed | Partially blistered | 4.9 |
| 7 | 60 sec. UV | No anomaly observed | Partially blistered | 4.9 |
| 8 | 30 sec. UV ($N_2$ atmosphere) | No anomaly observed | Partially blistered | 4.9 |
| 9 | 10 min. UV (254 nm) | Small blisters | Partially blistered | 0.98 |

Sample 1 was subjected to the above-mentioned plasma treatment for 5 minutes, and then irradiated with UV light for 30 seconds, after which it was electrolessly plated and electroplated in succession with copper. The conductor layer after the electroless plating and electroplating with copper exhibited a surface condition having no anomaly observed, and had a peel strength of 1.0 kgf/cm (9.8 N/cm) which is sufficient to produce a wiring board. Thus, sample 1 represents an embodiment of the invention.

By contrast, samples 2 to 9 represent comparative examples to the invention. In samples 2 and 3, roughening was carried out after the plasma treatment. In these samples, although the conductor layer had no anomaly, its peel strength was low.

Sample 4 was subjected, after the plasma treatment, to the roughening and additionally to UV treatment. In this sample, blisters were observed in the conductor layer after electroplating with copper.

Sample 5 was subjected only to plasma treatment, and the conductor layer after electroplating with copper was partially blistered and had a poor peel strength.

Samples 6 to 9 were subjected only to UV treatment, while changing the time for UV irradiation (samples 6 and 7), using a nitrogen atmosphere (sample 8), and using UV light having a different wavelength (sample 9).

In samples 6 and 7, the surface of the conductor layer after electroplating with copper was partially blistered, and the conductor layer had a low peel strength.

Sample 8 was irradiated with UV light in a nitrogen atmosphere. Also, in this case, the conductor layer after electroplating with copper was partially blistered, and had a poor peel strength. An object of UV irradiation in a nitrogen atmosphere was to carry out the evaluation under the conditions of eliminating the effects of ozone, which is generated by UV irradiation in the atmosphere. The test in this sample revealed that the sample irradiated with UV light in the nitrogen atmosphere had a partially blistered conductor layer and a poor peel strength like the other samples subjected only to UV irradiation in the atmosphere.

In sample 9, UV light having a wavelength of 254 nm irradiated by a low-pressure mercury lamp was used in place of UV light having a wavelength of 172 nm used in other examples. The test in this sample revealed that small blisters were already observed after the electroless plating with copper and the conductor layer after the electroplating with copper was partially blistered, and the conductor layer had a significantly low peel strength compared to the other samples. This indicates that UV light having a wavelength of 172 nm is more effective for UV treatment than UV light having a wavelength of 254 nm.

From the above results, it is understood that, as the treatment prior to the plating of an electrical insulation layer with copper, plasma treatment followed by UV treatment is appropriate. The insulation layer subjected to the plasma treatment and the UV treatment according to the invention has a much smaller surface roughness compared to insulation layers subjected to a conventional surface roughening treatment. The conventionally surface-roughened insulation layers have a surface roughness $R_z$ of the order of 4 to 5 micrometers but the insulation layer subjected to the plasma and UV treatments has a surface roughness $R_z$ equal to or smaller than 1 micrometer. Conventional conductor layers have a peel strength of the order of 9.8 N/cm, and sample 1, which represents an embodiment of the invention, has the conductor layer having a sufficient peel strength.

Figure 1:
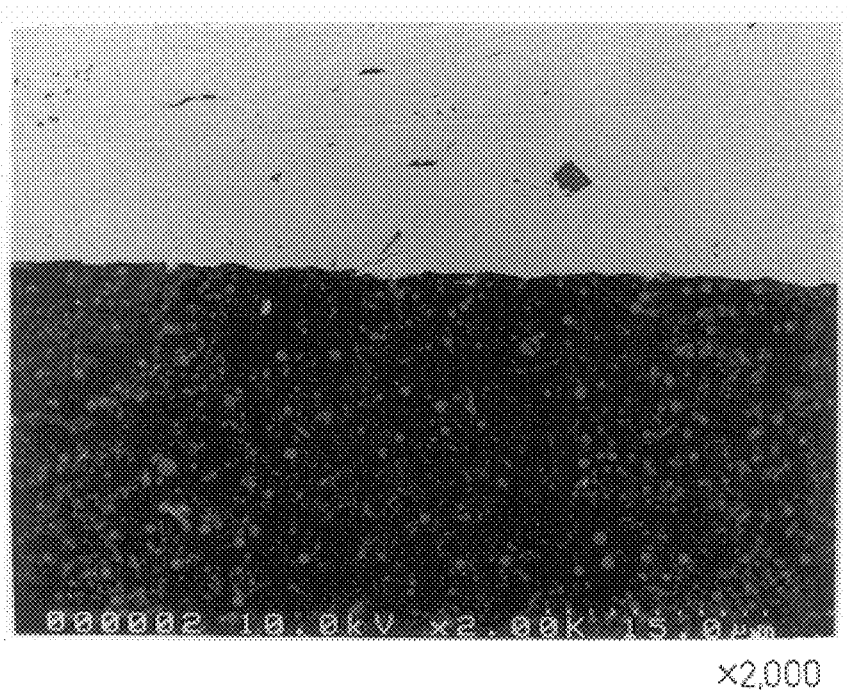
FIG. 1 shows an electron micrograph of a cross section of an insulation layer treated by plasma and ultraviolet (UV) light.
Figure 2:
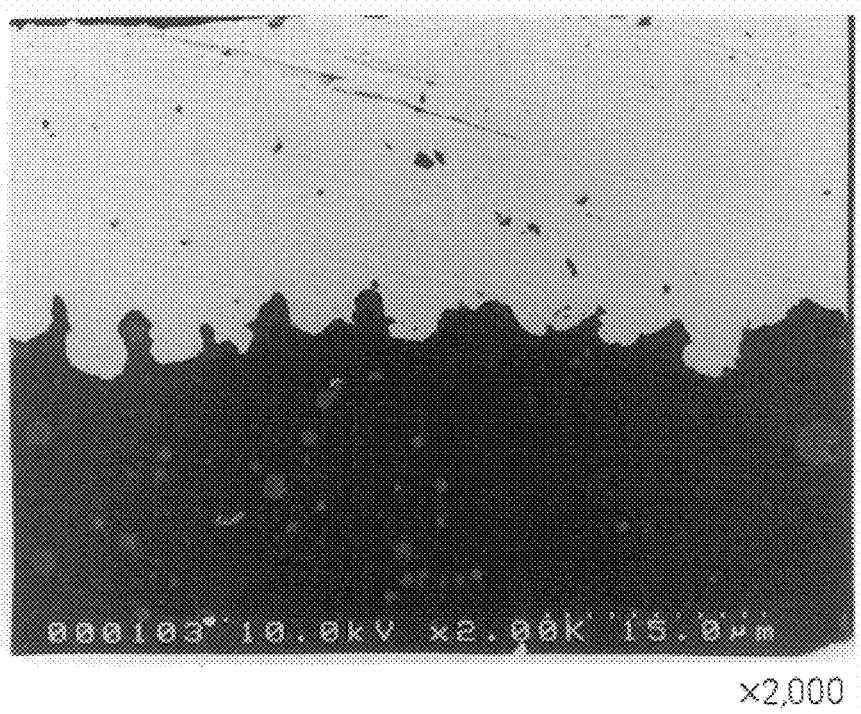
FIG. 2 shows an electron micrograph of a cross section of an insulating resin layer treated by roughening.

FIGS. 1 and 2 show electron micrographs of cross sections of insulation layers having a surface roughness different from each other. The micrograph of FIG. 1 was obtained from an insulation layer of a polyphenylene ether comprising an N-containing compound, which was subjected to plasma and UV treatments, and the micrograph of FIG. 2 was obtained from an insulation layer of a surface-roughened epoxy.

As described, the method of producing a wiring board according to the invention can keep the surface roughness of an insulation layer, made of a resin material, small by subjecting the insulation layer to a plasma treatment and a UV treatment in succession, and, at the same time, makes it possible to improve the adhesion between the insulation layer and a conductor layer, which is formed by electrolessly plating and electroplating the insulation layer with copper.

According to the invention, since the surface roughness of the insulation layer can be controlled to be small, penetration of an etchant, during the patterning of the conductor layer by etching to form wiring lines, into the interface between the insulation layer and the patterned wiring line is avoided, and it is possible to provide a fine wiring pattern. Further, since the adhesion of the conductor layer to the insulation layer is good, the patterned wiring lines are firmly adhered to the insulation layer even if the wiring lines are formed to have a fine pattern, and it is possible to provide a highly reliable wiring board. In addition, since the insulation layer can have a small surface roughness, the wiring board can have low high-frequency signal transmission loss and good high-frequency electrical properties.

In order to consider the effects of the plasma and UV treatments, the surfaces of plasma- and/or UV-treated insulation layers were analyzed by an infrared spectroscopic analysis (IR analysis).

A sample treated by plasma alone showed an absorption peak at 3210 cm$^{-1}$. From this result, it is understood that the plasma treatment generates —OH and —NH groups. A sample treated by UV alone showed an increased peak intensity at 1107 cm$^{-1}$. It is surmised that this increase in peak intensity is caused by the presence of CN and Si. In the case of a sample subjected to the plasma treatment followed by the UV treatment, an absorption peak was observed at 3390 cm$^{-1}$, and the absorption at 3210 cm$^{-1}$ was increased. It is understood that these treatments also generate —OH and —NH groups. In a sample subjected to the plasma treatment followed by roughening, the absorption peak at 3210 cm$^{-1}$ disappeared.

From these results, of IR analysis, it is understood that the effects of the generation of —OH and —NH groups, which is thought to contribute to the adhesion of electrolessly plated copper to a substrate, are increased by the successive plasma and UV treatments compared to the plasma treatment alone or the UV treatment alone. As described, the absorption peak at 3210 cm$^{-1}$ resulted from the plasma treatment disappears after the roughening, and a good result is not obtained by the successive plasma, roughening, and UV treatments. Consequently, it can be said that a plasma treatment followed by roughening is not effective even if the roughening is further followed by a UV treatment, and a plasma treatment successively followed by a UV treatment is particularly effective.

Also, from the results of the IR analysis described above, it is considered that the generation of —OH and —NH groups by the plasma and UV treatments contributes to the improvement of the adhesion of electrolessly plated copper to a resinous substrate. Accordingly, for a resin material forming an electrical insulation layer in a wiring board, a resin material, which generates —OH and/or NH group by the plasma and UV treatments, can be suitably used.

Various resin materials are supplied to be used for the formation of insulation layers in wiring boards, and such resin materials comprise, in general, a base material and a compound or compounds added thereto. Accordingly, it is preferred, in the method of producing a wiring board of the invention, that a resin material containing a compound, which can generate a functional group providing good adhesion to plated copper, by plasma and UV treatments, is used to form an electrical insulation layer.

A characteristic functional group in the above results of the IR analysis is the —NH group. Accordingly, as the resin material forming an electrical insulation layer, a resin material comprising an N-containing compound which generates such a functional group at the end of its molecule by a break in chemical bond due to plasma and UV treatments is considered to be appropriate. As the N-containing compounds, acrylonitrile, acrylamide, isocyanuric acid, triazines and the like can be enumerated.

As described, by successively treating an electrical insulation layer, on which a wiring line layer is to be located, by plasma and UV before electroless plating and electroplating of the insulation layer with copper, the method of producing a wiring board of the invention makes it possible to make the surface roughness of the insulation layer small, and make the adhesion of plated copper to the insulation layer good. Thus, the invention makes it possible to form a very fine wiring pattern, and provide a wiring board having a good electrical properties.

What is claimed is:

1. A method of producing a wiring board having a substrate and having a plurality of wiring conductor layers, each said conductor layer being located on an electrical insulation layer, wherein each said insulation layer has a small surface roughness and the adhesion between and insulation layer and a conductor layer is improved, comprising the steps of:

forming a plurality of electrical insulation layers successively on said substrate using a resin material to form each said insulation layer;

forming a conductor layer on the surface of each said electrical insulation layer, wherein each conductive layer is formed by successive steps of first electroless plating copper on a said electrical insulation layer and then subsequently electroplating with copper on said electroless plated copper; and thereafter patterning said plating to form a wiring layer;

wherein, after the formation of each electrical insulation layer on the substrate, the electrical insulation layer is subjected first to a plasma treatment, and then to a subsequent ultraviolet treatment, prior to said step of electroless plating copper and said subsequent electroplating with copper.

2. The method of claim 1, wherein said resin material forming the electrical insulation layer includes an adhesion improving compound.

3. The method of claim 2, wherein said adhesion improving compound is a nitrogen-containing compound.

4. The method of claim 3, wherein said insulation layer is treated by said plasma and said ultraviolet treatments to have a surface roughness $R_z \leq 1$ micrometer.

5. A method of forming a wiring board having a substrate and having a plurality of successive wiring layers each formed on an individual insulation layer, comprising the steps of:

forming a resin insulation layer on said substrate;

treating a resin insulation layer with a plasma treatment;

treating said plasma treated layer with an ultraviolet treatment;

electroless plating said ultraviolet treated layer with copper;

electroplating said copper electroless plated layer with copper; and patterning said electroplated layer to form a wiring layer; wherein said foregoing steps of forming through are repeated for each successive plural wiring layer formed.

* * * * *